US007297006B2

(12) United States Patent
Emme

(10) Patent No.: US 7,297,006 B2
(45) Date of Patent: Nov. 20, 2007

(54) FLEXIBLE CONNECTOR WITH PRINTED CIRCUIT LINES ENCIRCLING TWO AXES

(75) Inventor: Niels Peter Emme, Copenhagen (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/578,261

(22) PCT Filed: Nov. 13, 2003

(86) PCT No.: PCT/IB03/05124

§ 371 (c)(1),
(2), (4) Date: May 4, 2006

(87) PCT Pub. No.: WO2005/041369

PCT Pub. Date: May 26, 2005

(65) Prior Publication Data

US 2007/0082528 A1    Apr. 12, 2007

(51) Int. Cl.
*H01R 12/00* (2006.01)
(52) U.S. Cl. .......................................... 439/77; 439/67
(58) Field of Classification Search .................. 439/64, 439/65, 67, 77
See application file for complete search history.

(56) References Cited

U.S. PATENT DOCUMENTS 5,205,750 A * 4/1993 Darrow et al. ................ 439/77
5,330,365 A * 7/1994 Leeson .......................... 439/77
5,362,243 A * 11/1994 Huss et al. ................. 439/76.1
6,484,395 B1   11/2002 Marcus et al.
6,811,431 B2 * 11/2004 Hsieh .......................... 439/495

FOREIGN PATENT DOCUMENTS

| GB | 2 322 504 | 8/1998 |
| JP | 2002 111138 A | 4/2002 |
| WO | WO 02 102224 A2 | 12/2002 |

* cited by examiner

*Primary Examiner*—Khiem Nguyen
(74) *Attorney, Agent, or Firm*—Banner & Witcoff, Ltd.

(57) ABSTRACT

The invention relates to a flexible connector formed from a single layer flexible film with printed circuit lines. The flexible connector comprises a first connection means, a second connection means, a first part extending from the first connection means, wherein the first part is adapted to form a coiled part encircling a first axis, a second part extending from the second connection means, wherein the second part is adapted to form a coiled part encircling a second axis, and a third part interconnecting the first and second parts. The invention further relates to a method of manufacturing such a flexible connector, and a communication apparatus provided with such a flexible connector and comprising a first member and a second member, wherein the first and second members are mechanically connected by a two-axis hinge, and wherein circuitry of the first and second members are connected by said flexible connector.

10 Claims, 5 Drawing Sheets

US 7,297,006 B2

FLEXIBLE CONNECTOR WITH PRINTED CIRCUIT LINES ENCIRCLING TWO AXES

This application is a National Stage application of PCT application PCT/IB2003/005124 filed Nov. 13, 2003, which was published in English under PCT Article 21(2) on May 26, 2005. This application is incorporated herein by reference in its entirety.

FIELD OF INVENTION

The present invention relates to a flexible connector, a method of manufacturing a flexible connector, and a communication apparatus comprising a flexible connector.

BACKGROUND OF INVENTION

UK patent application no. GB 2322504 A discloses a tri-fold cellular telephone including a top housing portion, a center housing portion, and a bottom housing portion, where the portions are rotably coupled to each other via hinges. One portion includes a display, another includes a keypad, and still another includes a speaker and a battery. FIG. 8 in GB 2322504 A illustrates wires, carried through one of the hinges between the portions, for electrical interconnection of the foldable members of the cellular telephone. GB 2322504 is an illustrative example of a need for flexible connection lines between members in a cellular telephone. Other examples of elecronic devices needing this kind of flexible interconnections are video and digital cameras, lap-top computers, PDA:s, and calculators.

Japanese patent application no. JP 2002-111138 A discloses a flexible printed board with a pair of terminals provided at the ends of the board, and wirings between the terminals. The wirings are formed into two parts having an empty space between them and are provided with bending pleats such that the flexible printed board can be folded up along the bending pleats.

SUMMARY OF THE INVENTION

The present invention is based on the understanding that a lead-through of a electrical connector through a two-axes hinge needs to be able to take up movements caused both when the members of the communication apparatus are pivoted around a first axis, and when the members of the communication apparatus are pivoted around a second axis. In this context, the first and second axes are essentially perpendicular to each other. The present invention is further based on the understanding that a plurality of electrical connection lines need to be provided between circuitry of the members of the communication apparatus.

The above objects, advantages and features together with numerous other objects, advantages and features, which will become evident from the detailed description below, are obtained according to a first aspect of the present invention by a flexible connector formed from a single layer flexible film with printed circuit lines, said flexible connector comprising a first connection means and a second connection means, wherein said flexible connector further comprises a first part extending from the first connection means, wherein said first part is adapted to form a coiled part encircling a first axis;

a second part extending from the second connection means, wherein said second part is adapted to form a coiled part encircling a second axis; and a third part interconnecting said first and second parts.

The term "first", "second", and "third" should in this context be construed as terms for differentiating between elements and not be construed as a timing consideration.

The first coiled part encircling the first axis will take up movements caused by pivoting around said first axis, and the second coiled part will take up movements caused by pivoting around said second axis. Thus, mechanical stress on the flexible connector is reduced. The flexible connector will enable lead-through through a two-axis hinge.

Said first, second and third parts of the flexible connector according to the first aspect of the present invention may comprise two or more strips having essentially the same shape, and intermediate parts, each having a first and a second dividing line, wherein said first and second dividing lines are parallel, said intermediate parts being arranged between each end of said strips to enable folding along the dividing lines such that said two or more strips form overlapping layers after folding. This feature will provide more connection lines as more connection lines are demanded, when an increase of the total width of the strip is unfeasable, and a decrease of the width of each connection line is inappropriate. Said intermediate parts may be provided with an adhesive. The adhesive will ensure that the single layer flexible film does not unfold while storing, transporting, handling or using the flexible connector. Said adhesive may be a pressure-sensitive adhesive. This is advantageous, while the folded parts are exposed to pressure during manufacturing anyway.

Said second part of the flexible connector according to the first aspect of the present invention may comprise a first elongated sub-part, a second curved sub-part, and a third elongated sub-part, which third elongated sub-part is adapted to form said coiled part.

Said third part of the flexible connector according to the first aspect of the present invention may comprise a first curved sub-part, a second elongated sub-part, and a third curved sub-part.

The above objects, advantages and features together with numerous other objects, advantages and features, which will become evident from the detailed description below, are obtained according to a second aspect of the present invention by a method for manufacturing a flexible connector, said flexible connector comprising a first connection means and a second connection means, wherein said flexible connector further comprises a first part extending from the first connection means, wherein said first part is adapted to form a coiled part encircling a first axis;

a second part extending from the second connection means, wherein said second part is adapted to form a coiled part encircling a second axis; and a third part interconnecting said first and second parts, the method comprising the steps of:

printing said first and second connection means, and at least one strip between said first and second connection means provided with connection lines between the first and the second connection means, on a single layer flexible film, wherein said at least one strip forms said first, second and third parts; and cutting out said printed flexible film.

The term "first", "second", and "third" should in this context be construed as terms for differentiating between elements and not be construed as a timing consideration.

Said first, second and third parts of the flexible connector according to the second aspect of the present invention may comprise two or more strips having essentially the same shape, and intermediate parts, each having a first and a second dividing line, wherein said first and second dividing lines are parallel, said intermediate parts being arranged between each end of said strips, and said method may further comprise folding along the dividing lines such that said two or more strips form overlapping layers after folding. The method may further comprise providing said intermediate parts with an adhesive. Said adhesive may be a pressure sensitive adhesive, wherein said folding may further comprise applying a pressure on folded parts to activate said pressure sensitive adhesive.

The above objects, advantages and features together with numerous other objects, advantages and features, which will become evident from the detailed description below, are obtained according to a third aspect of the present invention by a communication apparatus comprising a first member and a second member, wherein said first and second members are mechanically connected by a two-axis hinge, said communication apparatus further comprising a flexible connector formed from a single layer flexible film with printed circuit lines, said flexible connector comprising a first connection means adapted to be connected to circuitry in the first member of said communication apparatus, and a second connection means adapted to be connected to circuitry in the second member of said communication apparatus, wherein said flexible connector further comprises a first part extending from the first connection means, wherein said first part form a coiled part encircling a first axis of said two-axes hinge;

a second part extending from the second connection means, wherein said second part form a coiled part encircling a second axis of said two-axes hinge; and a third part interconnecting said first and second parts.

The term "first", "second", and "third" should in this context be construed as terms for differentiating between elements and not be construed as a timing consideration.

Said first, second and third parts of the flexible connector according to the third aspect of the present invention may comprise two or more strips having essentially the same shape, and intermediate parts, each having a first and a second dividing line, wherein said first and second dividing lines are parallel, said intermediate parts being arranged between each end of said strips to enable folding along the dividing lines such that said two or more strips form overlapping layers after folding. Said intermediate parts may be provided with an adhesive. Said adhesive may be a pressure sensitive adhesive.

Said second part of the flexible connector according to the third aspect of the present invention may comprise a first elongated sub-part, a second curved sub-part, and a third elongated sub-part, which third elongated sub-part is adapted to form said coiled part.

Said third part of the flexible connector according to the third aspect of the present invention may comprise a first curved sub-part, a second elongated sub-part, and a third curved sub-part.

DETAILED DESCRIPTION OF A PREFERRED EMBODIMENT

In the following description of a preferred embodiment, reference is made to the accompanying drawings which form a part hereof, and in which is shown by way of illustration a preferred embodiment in which the invention may be practised. It is to be understood that other embodiments may be utilized and that structural and functional modifications may be made without departing from the scope of the present invention.

Figure 1:
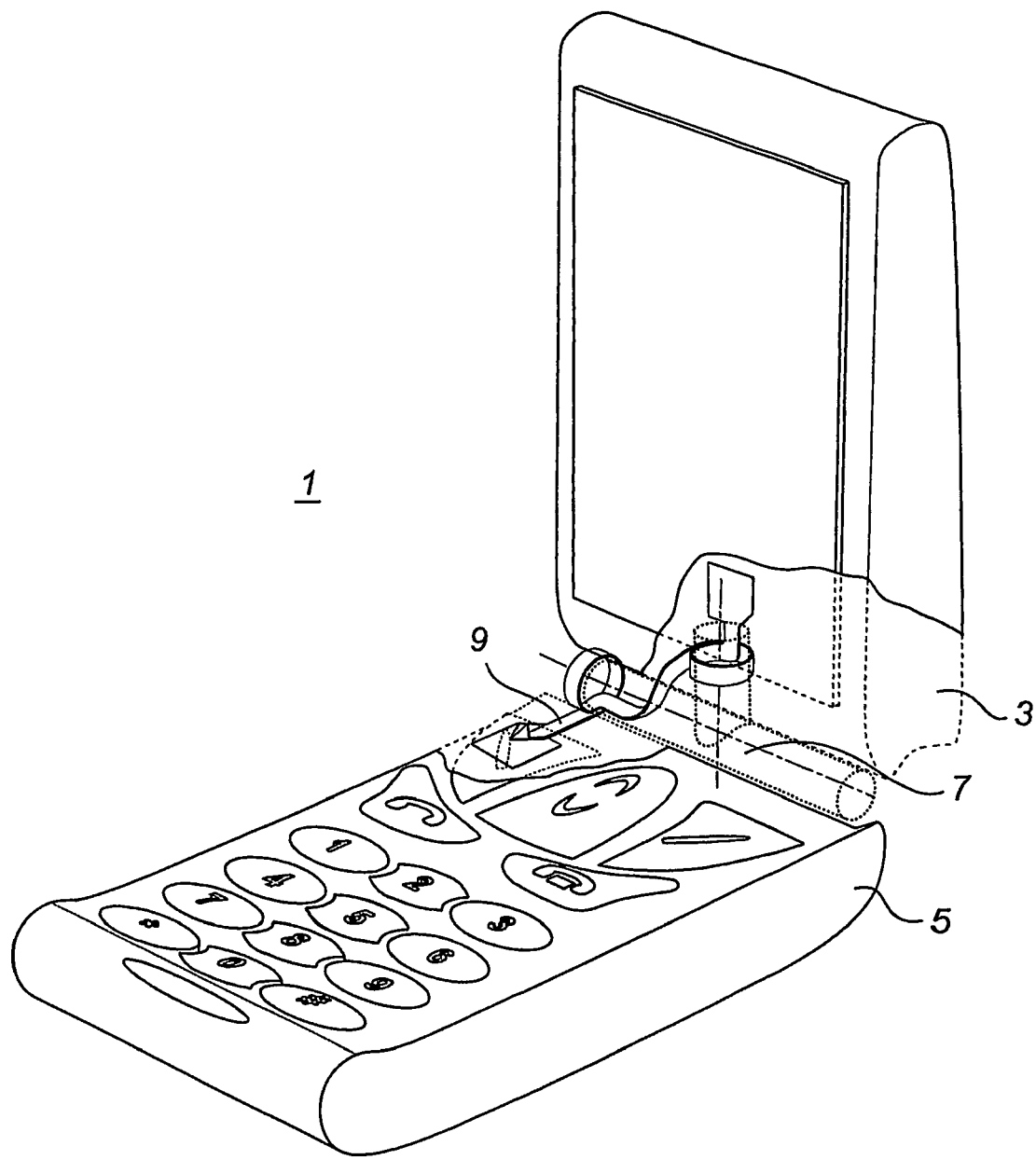
FIGS. 1, 2 and 3 show a communication apparatus comprising two members hinged to each other.
Figure 2:
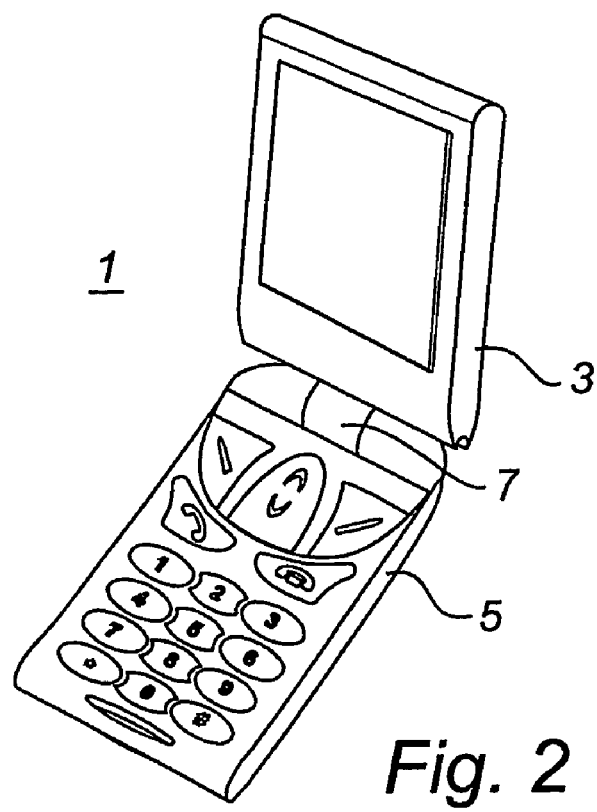
Figure 3:
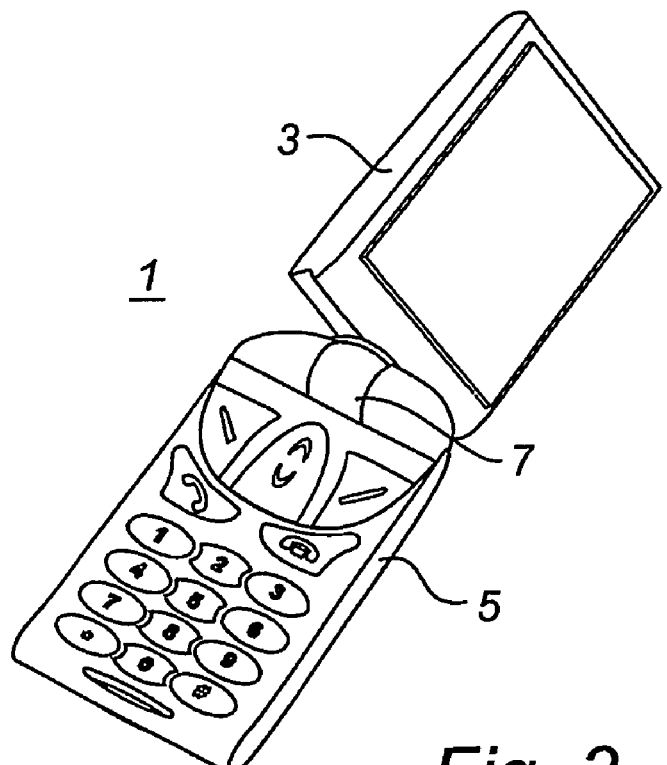

FIGS. 1, 2 and 3 show a communication apparatus 1 comprising two members 3, 5 hinged to each other. The members can be pivoted around two axes by means of a two-axes hinge 7. A flexible connector 9 is connected between first circuitry, e.g. a first printed circuit board (PCB), of the first member 3 of the communication apparatus 1 and second circuitry, e.g. a second PCB, of the second member 5 of the communication apparatus 1. The flexible connector 9 is provided to connect electrical signals to or from the first circuitry of the first member 3 of the communication apparatus 1 to the second circuitry of the second member 5 of the communication apparatus 1.

Figure 4:
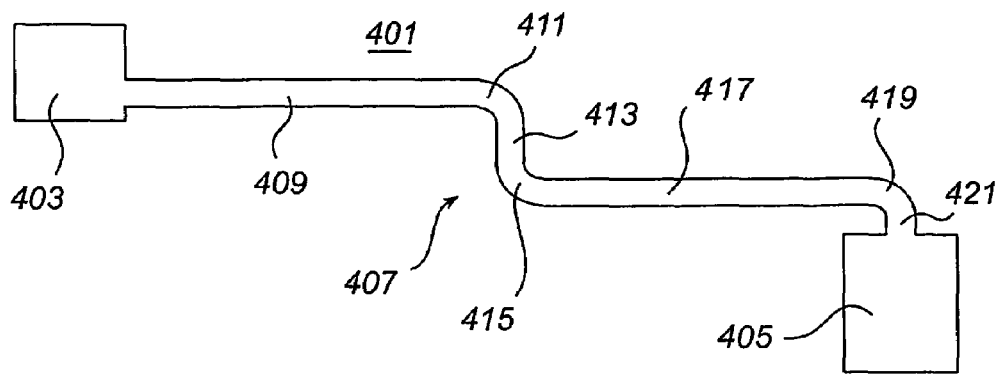
FIG. 4 shows a flexible connector.

FIG. 4 shows a flexible connector 401, provided with a first connection means 403 which is suited to be attached to first circuitry. The connector is further provided with a second connection means 405 which is suited to be attached to second circuitry. A strip 407 provided with one or more connection lines (not shown) is arranged between the first connection means 403 and the second connection means 405. A first part of the strip 409 is extending from the first connection means 403 to a second curved part 411 forming a bend from which the strip 407 extends in a third part 413 essentially perpendicular to the first part 409. The strip 407 is then provided with a fourth curved part 415 forming a bend from which the strip extends in a fifth part 417 essentially perpendicular to the third part 413, and essentially parallel to the first part 409. The strip 407 is further provided with a sixth curved part 419 forming a bend from which the strip 407 extends in a seventh part 421 essentially perpendicular to the fifth part 417, and essentially parallel to the third part 413. The seventh part 421 of the strip connects to the second connection means 405. Note that the description above of the flexible connector 401 only applies when the flexible connector 401 is flattened out and is regarded in one plane.

The flexible connector 401 is preferably made of a flexible film material. Preferably, the first and second connection means 403, 405 are made a bit stiffer than the rest of the flexible connector 401 to ease application at e.g. a PCB. The strip 407 is preferably provided with a multitude of connection lines, e.g. 20 connection lines each with a width of 100 μm, and a space with a width of 75 μm between each connection line, i.e. a distance of 175 μm from the center of one connection line to the center of next connection line.

As more connection lines are demanded, when an increase of the total width of the strip is unfeasable, and a decrease of the width of each connection line is inappropriate, there is a need for a multi-layer structure.

Figure 5:
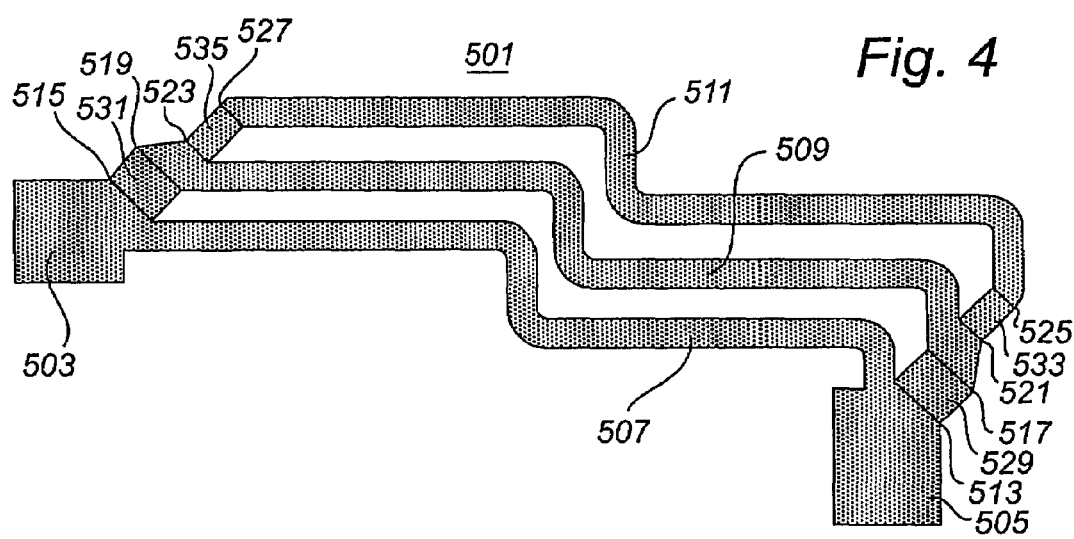
FIG. 5 shows a flexible connector comprising multiple strips.

FIG. 5 shows a flexible connector 501 provided with a first connection means 503 which is suited to be attached to first circuitry. The connector is further provided with a second connection means 505 which is suited to be attached to second circuitry. A first strip 507 provided with one or more connection lines (not shown) is arranged between the first connection means 503 and the second connection means 505. The first strip 507 is essentially of the same shape as the strip of the flexible connector shown in FIG. 4. The flexible connector 501 is further provided with a second strip 509 and a third strip 511. The second and third strips 509, 511 are essentially shaped like the first strip 507. The strips 507, 509, 511 have preferably the same width, e.g. 8 mm. Alternatively, the strips 507, 509, 511 have different widths, e.g. 10 mm for the first strip 507, 8 mm for the second strip 509, and 6 mm for the third strip 511. The flexible connector 501 is provided with intermediate parts 529, 531, 533, 535 between each strip 507, 509, 511. The intermediate parts 529, 531, 533, 535 each have a first dividing line 513, 515, 521, 523, and a second dividing line 517, 519, 525, 527 to the neighbouring strips 507, 509, 511. The first and second dividing lines 513, 515, 517, 519, 521, 523, 525, 527 are parallel. The flexible connector is adapted to be folded along the plurality of dividing lines 513, 515, 517, 519, 521, 523, 525, 527. It is preferrable to apply an adhesive on the intermediate parts 529, 531, 533, 535 to keep the shape of the flexible connector after folding, which will be described in detail below. Note that the description above of the flexible connector 501 only applies when the flexible connector 501 is flattened out and is regarded in one plane.

Figure 6:
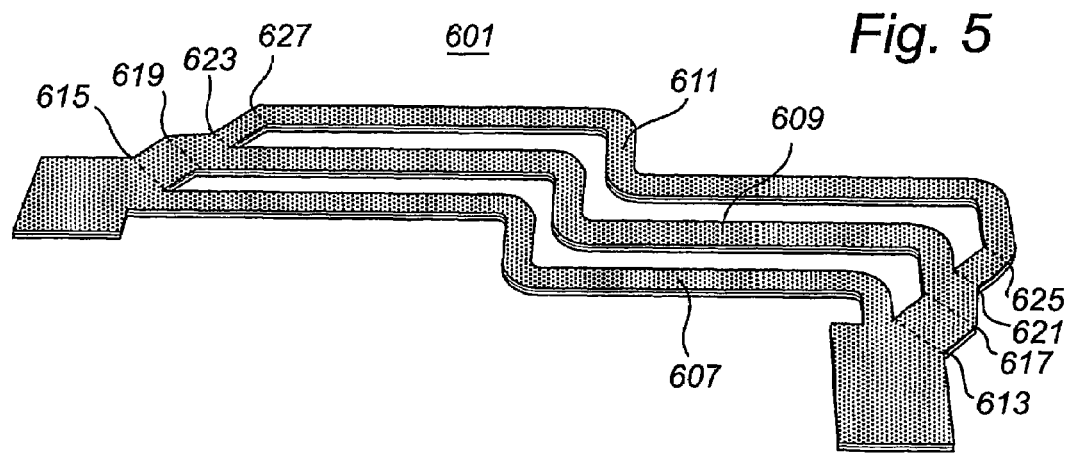
FIG. 6 is a perspective view of the flexible connector of FIG. 5.

FIG. 6 is a perspective view of the flexible connector of FIG. 5. The flexible connector 601 is provided with dividing lines 613, 615, 617, 619, 621, 623, 625, 627, which are parallel. This will enable a parallel displacement of the third strip 611 to a position above the second strip 609, and then a parallel displacement of the second and third strips 609, 611 to a position above the first strip 607. Thus, said first, second and third strips 607, 609, 611 will overlap after folding.

Figure 7:
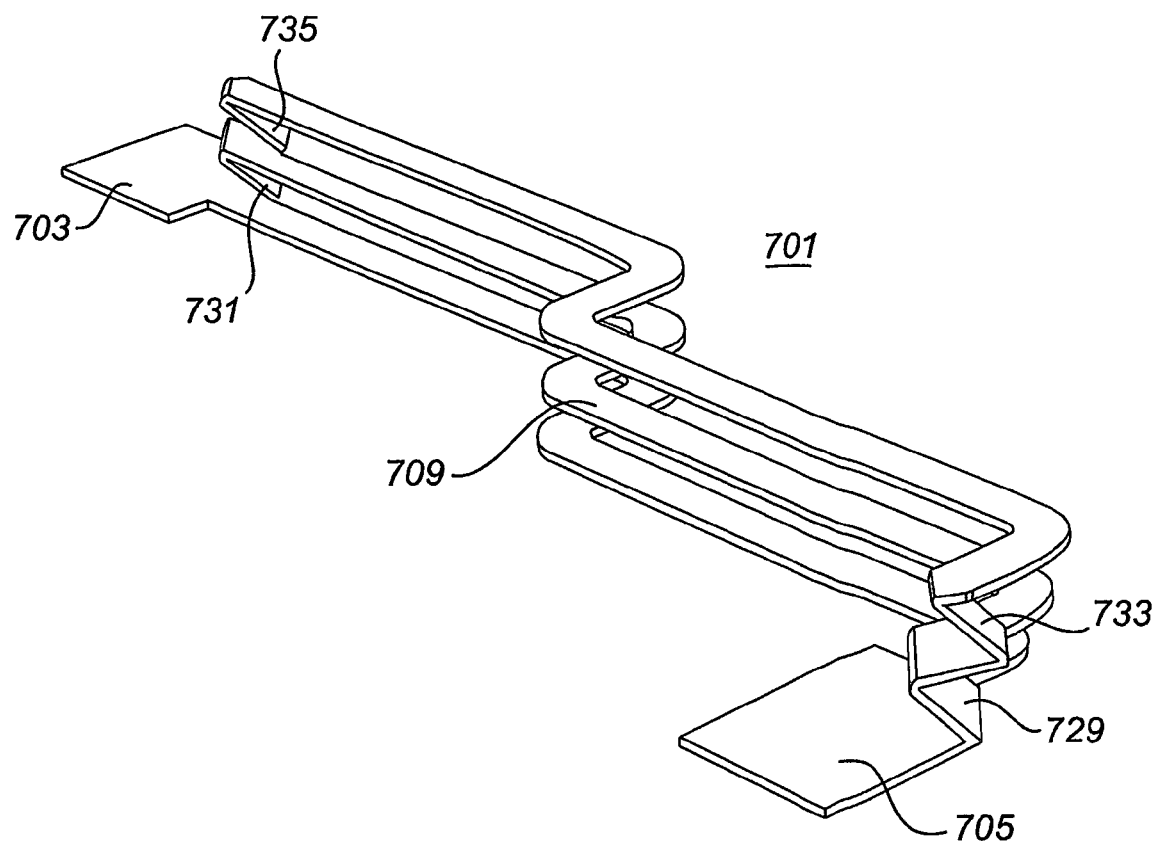
FIGS. 7 and 8 show folding of the flexible connector of FIGS. 5 and 6.
Figure 8:
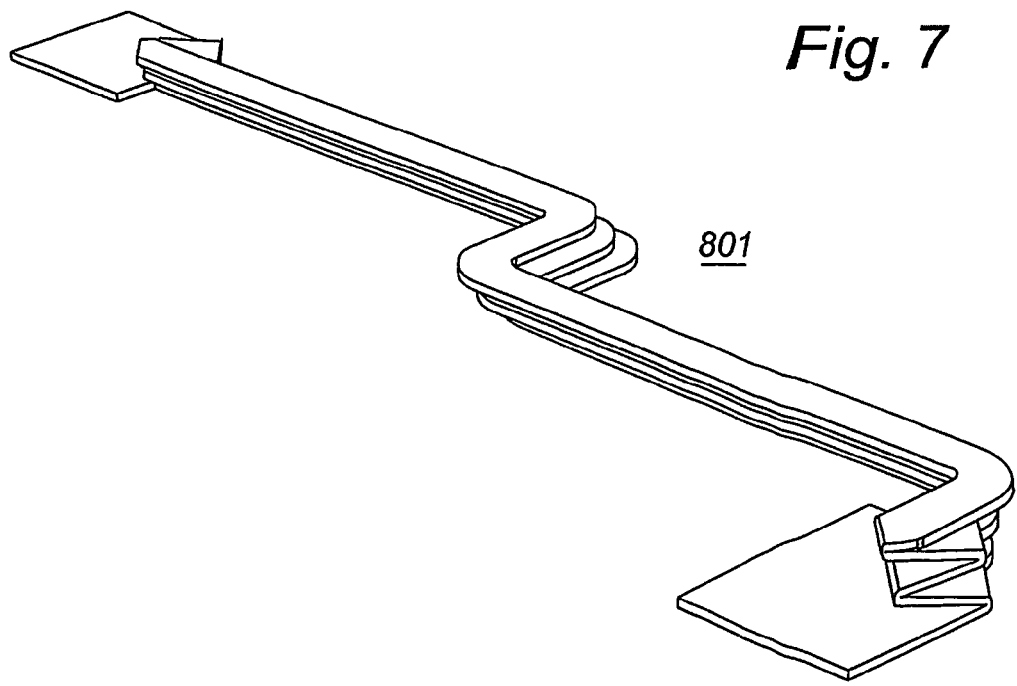

FIGS. 7 and 8 show folding of the flexible connector 701, 801. Note that adhesive on the areas (not shown) on the intermediate parts 729, 731, 733, 735 now will stick to connection means 703, 705 and strip 709, and will thus fix the folded parts. Pressure sensitive adhesive is preferably used, while the folded parts are exposed to pressure during manufacturing anyway. The adhesive will ensure that the single layer flexible film does not unfold while storing, transporting, handling or using the flexible connector.

Figure 9:
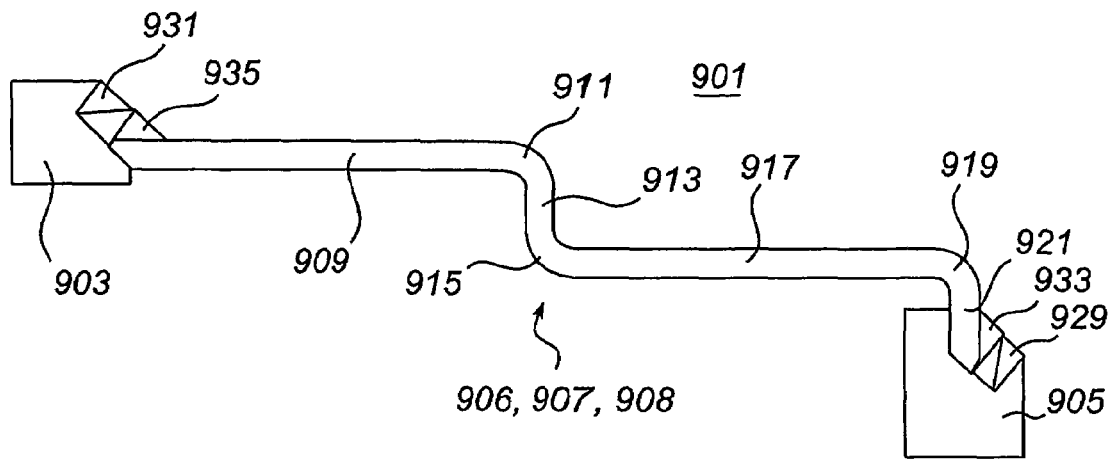
FIG. 9 shows the flexible connector of FIGS. 5-8 folded from a single layer flexible film to a multi-layer structure.

FIG. 9 shows a flexible connector 901 folded from a single layer flexible film, as shown in FIGS. 5-8, to a multi-layer structure, provided with a first connection means 903 which is suited to be attached to first circuitry. The flexible connector 901 is further provided with a second connection means 905 which is suited to be attached to second circuitry. First, second and third strips 906, 907, 908 are each provided with one or more connection lines (not shown), and are arranged between the first connection means 903 and the second connection means 905. A first part 909 of each of the strips is extending from the first connection means 903, wherein the second and third strips are connected via intermediate parts 931, 935, to a second curved part 911 forming a bend from which the strips 906, 907, 908 extend in a third part 913 essentially perpendicular to the first part 909. The strips 906, 907, 908 are then provided with a fourth curved part 915 forming a bend from which the strips extend in a fifth part 917 essentially perpendicular to the third part 913, and essentially parallel to the first part 909. The strips 906, 907, 908 are further provided with a sixth curved part 919 forming a bend from which the strips 906, 907, 908 extend in a seventh part 921 essentially perpendicular to the fifth part 917, and essentially parallel to the third part 913. The seventh part 921 of the strips connects to the second connection means 905, wherein the second and third strips are connected via the intermediate parts 929, 933. Said intermediate parts 929, 931, 933, 935 each have a first dividing line and a second dividing line to the neighbouring strips 906, 907, 908. The first and second dividing lines are parallel. Note that the description above of the flexible connector 901 only applies when the flexible connector 901 is flattened out and is regarded in one plane.

The flexible connector 901 is preferably made of a flexible film material. Preferably, the first and second connection means 903, 905 are made a bit stiffer than the rest of the flexible connector 901 to ease application at circuitry. The strips 906, 907, 908 are preferably each provided with a multitude of connection lines, e.g. 20 connection lines, each with a width of 100 μm, and a space with a width of 75 μm between each connection line, i.e. a distance of 175 μm from the center of one connection line to the center of next connection line.

Alternatively, it is preferable to provide one strip with only one connection line, e.g. a full width copper layer to enhance performance related to electromagnetic compatibility and/or electrostatic discharges. Preferably, the first strip 906 is provided with one full copper layer, since it has the shortest path between the connectors 903, 905, and therefore normally, provides best performance related to electromagnetic compatibility and/or electrostatic discharges. This is true in many applications, but for some applications it may be more beneficiary to use another of the strips for this purpose.

Figure 10:
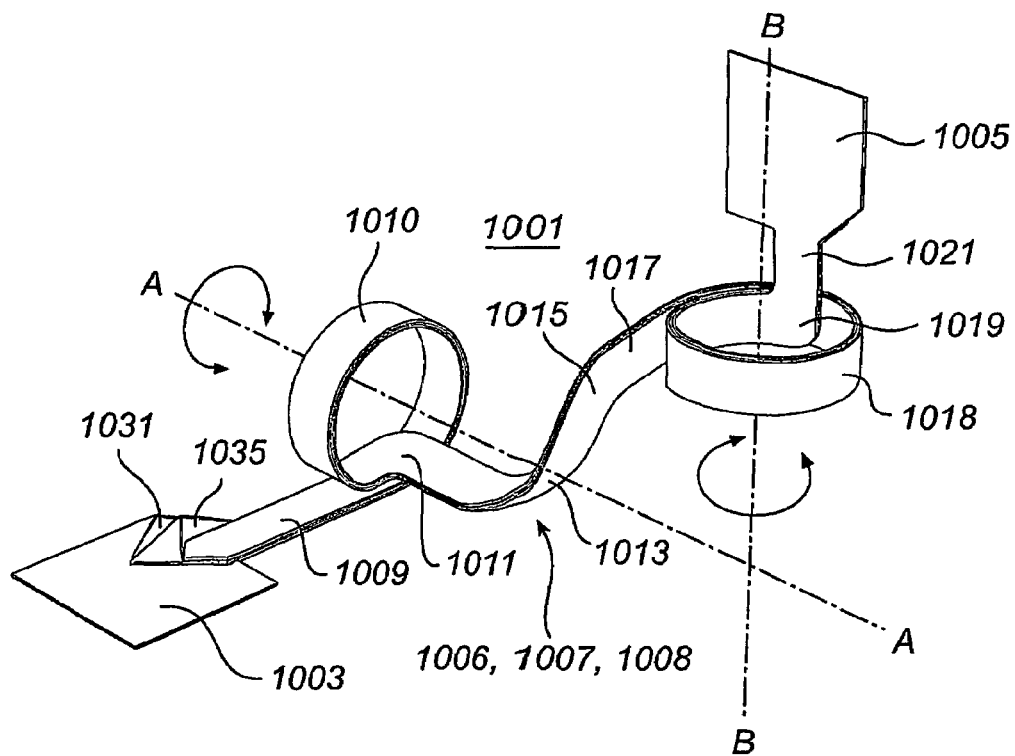
FIG. 10 shows the flexible connector of FIG. 9 as applied in a two-axis hinge.

FIG. 10 shows the flexible connector of FIG. 9 as applied in a two-axes hinge (not shown) of e.g. a communication apparatus. The flexible connector 1001 provided with a first connection means 1003 which is suited to be attached to first circuitry. The flexible connector 1001 is further provided with a second connection means 1005 which is suited to be attached to second circuitry. First, second and third strips 1006, 1007, 1008 are each provided with one or more connection lines (not shown), and are arranged between the first connection means 1003 and the second connection means 1005. A first part 1009 of each of the strips is extending from the first connection means 1003, wherein the second and third strips are connected via intermediate parts 1031, 1035, wherein the first part 1009 forms a coiled sub-part 1010 encircling a first axis A-A. Preferably, the lengths of the first part 1009 of the different strips 1006, 1007, 1008 are slightly different to enable forming of the coiled sub-part 1010, since the different strips 1006, 1007, 1008 will have slightly different curvature at the coiled sub-part 1010. A second curved part 1011 forms a bend from which each of the strips 1006, 1007, 1008 extends in a third part 1013 in a direction of the first axis A-A towards a second axis B-B. The third part 1013 forms a curve, which is possible due to its flexible nature, such that it at the end, next to a fourth curved part 1015, is essentially parallel to the second axis B-B. The fourth curved part 1015 forms a bend from which the strips extend in a fifth part 1017, wherein the fifth part 1017 forms a coiled sub-part 1018 encircling the second axis B-B. Preferably, the lengths of the fifth part 1017 of the different strips 1006, 1007, 1008 are slightly different to enable forming of the coiled sub-part 1018, since the different strips 1006, 1007, 1008 will have slightly different curvature at the coiled sub-part 1018. The strips 1006, 1007, 1008 are further provided with a sixth curved part 1019 forming a bend from which the strips 1006, 1007, 1008 extend in a seventh part 1021 in a direction essentially parallel to the second axis B-B. The seventh part 1021 of the strips connects to the second connection means 1005, wherein the second and third strips are connected via the intermediate parts (not shown).

The flexible connector 1001 is arranged to lead through the two-axis hinge, the first connection means 1003 is attached to the first circuitry, and the first part 1009 of the pack of strips 1006, 1007, 1008 extends into the hinge and is coiled 1010 around the first axis A-A to be able to take up movements caused when the members of the communication apparatus are pivoted around the first axis A-A. Similarly, the fifth part 1017 is coiled 1018 around the second axis B-B to take up movements caused when the members of the communication apparatus are pivoted around the second axis B-B. The seventh part 1021 of the pack of strips 1006, 1007, 1008 extends from the coiled part 1018, formed by the third part 1021 of the pack of strips 1006, 1007, 1008, towards the second connection means 1005, which is attached to the second circuitry.

Thus, mechanical stress of the flexible connector is minimized as the communication apparatus is folded, unfolded, and pivoted a great number of times around axes A-A and B-B. Therefore, a reliable connection is provided between the circuitry of the members of the communication apparatus.

The preferred embodiment has three strips, but it is also possible to provide a flexible connector with one strip, as shown in FIG. 4. Further, it is possible to provide a flexible connector with 2, 4, 5 or more strips.

When the flexible connector is provided with two or more strips, wherein each strip has essentially the same shape, as described for the three strip embodiment above, the flexible connector is provided with intermediate parts between each strip, each intermediate part having a first and a second dividing line. The first and second dividing lines are parallel to enable parallel displacement of the strips, analogous to the preferred embodiment. Preferably, the lengths of the first part of the different strips are slightly different to enable forming of the coiled sub-part, since the different strips will have slightly different curvature at the coiled sub-part. Preferably, the lengths of the fifth part of the different strips are slightly different to enable forming of the coiled sub-part, since the different strips will have slightly different curvature at the coiled sub-part. The different strips have preferably the same width, e.g. 8 mm. Alternatively, the different strips have different widths.

The invention claimed is:

1. A flexible connector formed from a single layer flexible film with printed circuit lines, said flexible connector comprising a first connection means, and a second connection means, wherein said flexible connector further comprises
   a first part extending from the first connection means, wherein said first part is adapted to form a coiled part encircling a first axis;
   a second part extending from the second connection means, wherein said second part is adapted to form a coiled part encircling a second axis; and
   a third part interconnecting said first and second parts.

2. The flexible connector of claim 1, wherein said first, second and third parts comprise two or more strips having essentially the same shape, and intermediate parts, each having a first and a second dividing line, wherein said first and second dividing lines are parallel, said intermediate parts being arranged between each end of said strips to enable folding along the dividing lines such that said two or more strips form overlapping layers after folding.

3. The flexible connector of claim 2, wherein said intermediate parts are provided with an adhesive.

4. The flexible connector of claim 3, wherein said adhesive is a pressure sensitive adhesive.

5. The flexible connector according to claim 1, wherein said second part comprises a first elongated sub-part, a second curved sub-part, and a third elongated sub-part, which third elongated sub-part is adapted to form said coiled part, and said third part comprises a first curved sub-part, a second elongated sub-part, and a third curved sub-part.

6. A communication apparatus comprising a first member and a second member, wherein said first and second members are mechanically connected by a two-axis hinge, said communication apparatus further comprising a flexible connector formed from a single layer flexible film with printed circuit lines, said flexible connector comprising a first connection means adapted to be connected to circuitry in the first member of said communication apparatus, and a second connection means adapted to be connected to circuitry in the second member of said communication apparatus,
   wherein said flexible connector further comprises
   a first part extending from the first connection means, wherein said first part forms a coiled part encircling a first axis of said two-axes hinge;
   a second part extending from the second connection means, wherein said second part forms a coiled part encircling a second axis of said two-axes hinge; and
   a third part interconnecting said first and second parts.

7. The communication apparatus of claim 6, wherein said first, second and third parts comprise two or more strips having essentially the same shape, and intermediate parts, each having a first and a second dividing line, wherein said first and second dividing lines are parallel, said intermediate parts being arranged between each end of said strips to enable folding along the dividing lines such that said two or more strips form overlapping layers after folding.

8. The communication apparatus of claim 7, wherein said intermediate parts are provided with an adhesive.

9. The communication apparatus of claim 8, wherein said adhesive is a pressure sensitive adhesive.

10. The communication apparatus according to claim 6, wherein said second part comprises a first elongated sub-part, a second curved sub-part, and a third elongated sub-part, which third elongated sub-part is adapted to form said coiled part, and said third part comprises a first curved sub-part, a second elongated sub-part, and a third curved sub-part.

* * * * *